United States Patent [19]

Ekin et al.

[11] Patent Number: 4,963,523

[45] Date of Patent: Oct. 16, 1990
:::

[54] HIGH-$T_c$ SUPERCONDUCTING UNIT HAVING LOW CONTACT SURFACE RESISTIVITY AND METHOD OF MAKING.

[75] Inventors: John W. Ekin, Boulder, Colo.; Armand J. Panson; Betty A. Blankenship, both of Pittsburgh, Pa.

[73] Assignees: The United States of America as represented by the Secretary of the Commerce, Washington, D.C.; Westinghouse Electric Corporation, Pittsburgh, Pa.

[21] Appl. No.: 117,259

[22] Filed: Nov. 6, 1987

[51] Int. Cl.$^5$ .................. C23C 14/04; C23C 14/02; C23C 14/34; B05D 5/12

[52] U.S. Cl. .................. 505/1; 505/706; 427/62; 427/63; 204/192.17; 204/192.3; 204/192.32

[58] Field of Search .......... 204/192.17, 192.3, 192.32; 505/1, 706; 156/643; 427/62, 63

[56] References Cited

U.S. PATENT DOCUMENTS

| | | |
|---|---|---|
| 3,703,254 | 11/1972 | Maierson et al. |
| 3,915,369 | 10/1975 | Schmidt-Bruecken et al. |
| 3,993,411 | 11/1976 | Babcock et al. |
| 4,056,642 | 11/1977 | Saxena et al. ........... 204/192.17 |
| 4,337,133 | 6/1982 | Augis et al. |
| 4,423,430 | 12/1983 | Hasuo et al. ........... 357/5 |
| 4,544,091 | 10/1985 | Hidler et al. |
| 4,562,121 | 12/1985 | Thiemann et al. |
| 4,660,061 | 4/1987 | Sweeney et al. ........... 357/5 |

OTHER PUBLICATIONS

Advanced Ceramic Materials–Ceramic Superconductors, vol. 2, No. 3B, Jul. 1987, pp. 388–400, ACerS, Westerville, OH, US.
R.W. McCallum et al., "Problems in the Production of YBa2Cu3Ox Superconducting Wire" (p. 391, paragraph 4).
Japanese Journal of Applied Physics, vol. 26, No. 7, Jul. 1987, pp. L1240–L1243, Tokyo, JP, K. Hayashi et al. "Preparation and Characterization of Ba-Y-Cu-O Single Crystals"(p. L1240, column 2, lines 18–23).
EP-A-O 281 474 (Sumitomo) (Abstract, lines 8–12).
Applied Physics Letters, vol. 51, No. 11, 14th Sep. 1987, pp. 861–863, American Institute of Physics, New York, US.
X. D. Wu et al., "Epitaxial Ordering of Oxide Superconductor Thin Films on (100) SrTiO3 prepared by Pulsed Laser Evaporation" (p. 861, column 2, lines 2–4).
EP-A-O 290 331 (Sumitomo) (Abstract; p. 3, lines 58–65; p. 10, lines 51–53).
"Improved Low Contact Resistance in High $T_c$ Y-Ba--Cu-O Ceramic Superconductors", J. van der Maas, V. A. Gasparov & D. Pavuna, Aug. 13, 1987.
Orlando et al., Phys. Rev. Let., (preprint on Jul. 1987).
Farrell et al., Phys. Review B., Jun. 1, 1987 (vol. 35, No. 16), pp. 8797–8799.
Vossen et al., Thin Film Processes, (Academic Press, NY), C. 1978, pp. 42–45.
Maissel et al., Handbook of Thin Film Tech. (McGraw-Hill, NY), c. 1970, pp. 7-49–7-52 and 23-12.
Nelson et al., Chemistry of High-T Superconductors (ACS-Aug. 1987), pp. 308–312.
Ginley et al., Ext. Abs. –High Tc Superconductors (MRS Spring meeting, Apr. 23–24, 1987), pp. 201–204.
Noto et al., Jap. J. of App. Phys. Letters, vol. 26, No. 5, May 1987, pp. L802–L803.
Kurisu et al., Jap J. of Appl. Phys. Letters, vol. 26, No. 4, Apr. 1987, pp. L361–L362.
Hikita et al., Jap. J. of App. Phys. Letters, vol. 26, No. 5, May 1987, pp. L615–L616.
Aoki et al., Jap J. of App. Phys. Letters, vol. 26, No. 5, May 1987, pp. L711–L713.

*Primary Examiner*—Norman Morgenstern
*Assistant Examiner*—Margaret Bueker
*Attorney, Agent, or Firm*—Thomas Zack; Alvin Englert; Robert E. Harris

[57] ABSTRACT

A low resistivity contact to a high-Tc superconductor is made by forming a contact pad on the surface of an abraded or freshly prepared superconductor by depositing an inert metal on the surface so that a surface resistivity between the surface of the high-Tc superconductor and the pad is established of less than about $1000 \mu\Omega\text{-cm}^2$ at high-Tc superconductor operating temperatures.

21 Claims, No Drawings

HIGH-$T_c$ SUPERCONDUCTING UNIT HAVING LOW CONTACT SURFACE RESISTIVITY AND METHOD OF MAKING.

This invention relates to a method and unit for achieving low resistivity contacts to high-Tc superconductors.

BACKGROUND OF THE INVENTION

In superconductors, there is a critical temperature or Tc at which resistance to the passage of electricity disappears. Conventional superconducting metals, alloys, and compounds have critical temperatures ranging from just above absolute zero to about 15–20° K. Practical applications for such superconductors are limited because they are operative only at extremely low temperatures.

A new class of superconductors, designated high-Tc superconductors, has recently been discovered and is being extensively investigated. The members of this class have much higher critical temperatures making it possible to use them in devices of commerce. $Y_1Ba_2Cu_3O_7$, for example, has a critical temperature of about 93° K.

In most of their commercial applications, superconductors are or will be electrically connected to other components of the device containing them. It is essential that the resistivity of the connections be low, particularly where high currents are to be carried, such as in transmission lines, generators and motors, and in energy storage devices and other magnetic applications. Low resistivity connections are required for superconductors which are part of an integrated circuit in high density, high speed computers to reduce the heat loads in such computers.

Low resistivity contacts ar especially important for high-Tc superconductors, since even moderate resistance-caused heating can raise the temperature of a superconductor enough to significantly lower its critical-current density. Low resistivity contacts are required for high-Tc superconductors in both bulk applications, such as electromagnets, and in thin-film devices, such as computers. Contact resistivity is expressed in terms of surface resistivity $\rho\square = RA$, where R is the contact resistance, and A is the contact area. For small magnet applications at liquid nitrogen temperatures, contact resistivities less than about $10^{-5}$ $\Omega$-cm$^2$ are required to limit heating at the contact to acceptable levels. For circuit board applications, contact resistivities less than about $10^{-4}$ $\Omega$-cm$^2$ are required for the external wire-bond connections to superconducting integrated-circuit chips.

Contacts made with indium solder, silver paint, direct wire bonds and pressure contacts have a contact surface resistivity typically in the range $10^{-2}$ to 10 $\Omega$-cm$^2$, several orders of magnitude too high for practical applications.

It is known to deposit metals on ceramic components to provide a situs for electrical connections to leads fabricated of copper or other conductive metal. Deposition by sputtering is particularly desirable because the metal deposited strongly adheres to the ceramic substrate. It is known from U.S. Pat. No. 4,337,133 to use sputtered gold as the metal to prepare conductive electrical contact surfaces. It is known from the paper titled "Metallization Of Ceramics For Electronic By Magnetron-Plasmatron Coating" by *Schiller et al* in *Thin Films*, 72, 313–326 (1980), that ceramics having silver deposited thereon exhibit good solderability. Various other methods of joining or soldering metals to refractory materials are disclosed in U.S. Pat. No. 3,915,369 and 3,993,411.

Typical leads for connecting components in an electrical device or system are copper wires, silver wires, aluminum wires, gold-plated wires and the like. However, connecting such leads to high-Tc superconductors by conventional means such as soldering using flux-containing solders of the type described in U.S. Pat. No. 3,703,254, or even with indium-based solders, results in a relatively high resistivity connection which can adversely affect desirable properties of the superconductor. High resistivity connections can result even if the superconductor contains a metal contact pad.

SUMMARY OF THE INVENTION

It has been discovered that a low resistivity contact to a high-Tc superconductor is obtained when the contact is made to a non-degraded surface of the superconductor via a metal contact pad using an inert metal. By inert metal is meant a metal that is not readily oxidized such as a noble metal such as gold, platinum, palladium, silver and the like. The contact pad both protects the superconductor surface from exposure to the air as well as providing a situs for attaching external leads. A clean or fresh non-degraded surface is provided by abrading the surface of the superconductor. While abrasion by mechanical means can be utilized, sputter-etching of the superconductor just prior to deposition is preferred. And when combined with sputter deposition, results in a strong bond between the deposited metal and the superconductor.

The present invention provides a method and unit for achieving low resistivity electrical connections between high-Tc superconductors and other components in a device or system. Resistivities of less than $10^{-5}$ $\Omega$-cm$^2$ have been achieved.

More specifically, the present invention provides a superconductor structure having a contact unit with a surface resistivity lower than heretofore achieved.

More specifically, the present invention also includes a method for making a low resistivity contact to a high-Tc superconductor which comprises abrading a surface of a high-Tc superconductor, and forming an inert metal contact pad on the abraded surface with a noble metal.

In another embodiment, the present invention is a method for making a low-resistivity contact to a high-Tc superconductor which comprises preparing a high-Tc superconductor by firing in an oxygen furnace, minimizing contact of the just prepared superconductor with air, and forming an inert metal contact pad on a surface of the superconductor with a noble metal.

The lead or leads to be connected to the ceramic superconductor are soldered to the contact pad or pads by soldering or by thermosonic bonding techniques. A low-melting solder such as indium (melting point 156° C.) or In-2 wt % Ag (melting point 150°) is preferred. The solder utilized should be flux-free or contain only a very small amount of flux.

Using this method, contacts have been made which consistently have surface resistivities $\rho\square$ of about $10^{-5}$ $\Omega$-cm$^2$. This is several thousand times less than the resistivities obtained using conventional indium-solder or silver-paint and silver epoxy contacts. Also, the contacts prepared according to the method of the present invention are capable of carrying current loads of several hundred amperes without apparent degradation, whereas silver paint and silver epoxy contacts burn out at about 0.1 A/mm. In addition, the present contacts do not degrade when exposed to dry air for a period of at least four months. The contact process is carried out at relatively low temperatures and therefore avoids possible degradation of the underlying superconductor, as well as allowing post-reaction shaping and processing steps before the contacts are applied.

A connection can be made without first forming a metal contact pad on the surface of the superconductor. However, the resistivity of the connection will be many hundred times greater than if a contact pad was present.

DETAILED DESCRIPTION OF THE INVENTION

High-Tc superconductors are usually prepared by a procedure which involves firing in an atmosphere of oxygen, as described by Panson et al. Phys. Rev. B35, 8774 (1987). In one embodiment, the method of the present invention is practiced without removing the just prepared high-Tc superconductor from the oxygen atmosphere of the firing oven in which it has been prepared. Without limiting the invention to any theoretical method of operation, it is believed that exposure of a high-Tc superconductor to the atmosphere, i.e., air containing water vapor and carbon dioxide, causes a reaction to take place at the surface of the superconductor which results in an increase in the resistivity of any electrical contact or connection subsequently formed. However, low-resistivity contacts acceptable for many purposes can be prepared if the degraded surface layer is removed or if it is kept from forming in the first place by eliminating exposure of the surface to air.

The metallic contact pad on the high-Tc superconductor is made with an inert metal by depositing or sputtering a thin layer of the metal onto a predetermined portion or portions of the surface of the superconductor. Sputtering is particularly effective in forming a low resistivity contact, because the surface can be sputter etched to remove the degraded surface layer before sputter depositing the contact pad. Also, the sputter deposition process generally results in superior adhesion.

Silver and gold are particulary preferred as contact pad materials since both are inert with strongly positive standard reduction potentials. Silver has the added advantage that its oxides dissociate at a fairly low temperature, and its oxygen diffusion coefficient is fairly high, which allows oxygen permeability at moderate temperatures.

The leads are connected to the contact pad, preferably by soldering with a low melting solder such as indium or a low melting indium alloy, or by thermosonic bonding techniques. To form a low resistivity connection by soldering, low temperatures and minimum heating times should be utilized.

To avoid the need to abrade the surface of the superconductor or to minimize the amount of abrading required, it is necessary that the metal contact pad be formed on the high-Tc superconductor as rapidly as possible after the superconductor has been prepared by firing or the surface of the superconductor must be protected from degradation by storage in an inert medium such as an inert fluorocarbon or in a pure oxygen atmosphere free of water vapor and carbon dioxide. Storage in a conventional laboratory desiccator is not sufficient.

A systematic investigation of indium solder contact samples showed that longer air exposure time between firing in oxyen and making the contacts correlated with a contact resistivity increase and non-ohmic behavior. As the air exposure time in a desiccator was decreased from 38 days to 9 days, the $\rho\Box$ decreased from $5.5\times10^{-2}$ $\Omega$-cm$^2$ to $1.5\times10^{-2}$ $\Omega$-cm$^2$. Removal of the degraded surface layer by mechanical abrasion resulted in a resistivity decrease to $3.6\times10^{-3}$ $\Omega$-cm$^2$ and more nearly ohmic behavior. The best indium contacts were made by using eutectic In-2% Ag solder (without soldering flux), and mechanically abrading the surface under the molten solder with either the tip of the soldering iron or with an ultrasonic soldering iron. Surface degradation occurs within a very short time scale, since polishing the superconductor surface several seconds before applying the indium solder did not result in a comparable decrease in contact resistivity. These early contact results also showed that, chemically, indium was not a good candidate material for making contacts. The resistivity of the contact typically increased more than 50% several days after making the contact.

The indium contacts were semiconducting in character; the resistivity increased about 3 to 7 times as the temperature was lowered from 295 K. to 76 K. The contacts were also non-ohmic, with the resistivity decreasing as current was increased. Contacts prepared using the preferred method were metallic in character, with resistivity decreasing 3 to 12 times on cooling from 295 K. to 76 K. (see second last column in Table I).

Our invention is further illustrated by means of the following non-limiting examples:

Conventionally prepared bulk-sintered samples of $Y_1Ba_2Cu_3O_7$ were used as the high-Tc superconductor. After firing had been completed, the superconductor was cooled in oxygen, cut into bars 3.2 mm wide by 12 mm long and placed in a sputter vacuum chamber. Total exposure time of the $Y_1Ba_2Cu_3O_7$ to air was about 0.8 hour in Examples 1, 2, 4, 5 and 6 and 2.0 hours in Example 3.

The sputter system utilized for deposit of the metal contact pad was pumped down overnight to a base pressure of about $70\mu$ Pa. The superconductor surface was sputter etched to a depth of 200 to 500Å in a 3 Pa pressure of argon at 1.25 kV rms. A 1 to 6 $\mu$m thick contact pad was then sputtered onto the $Y_1Ba_2Cu_3O_7$ surface over a 15 to 30 minute period in an argon atmosphere with 4.2 kV rms on the sputter target and no applied bias. The $Y_1Ba_2Cu_3O_7$ sample was held at temperatures less than 100° C. by a water cooled sample holder.

External connections were made to the sputtered silver contact pads in two different ways, first by soldering copper wires to the silver pads as would be appropriate for magnet and other bulk applications (Examples 1 and 3) and by ribbon-bonding fine gold leads appropriate for integrated circuit applications (Examples 2, 4, 5 and 6).

In Examples 1 and 3, the silver pad was indium coated with In-2% Ag solder without the use of a flux. Two wires were soldered to the contact pad, one to carry current and the other to detect voltage at the surface of the pad.

In Examples 2, 4, 5, and 6, fine gold current and voltage leads about 8 $\mu$m $\times$ 80 $\mu$m were attached using a thermosonic ribbon bonder to the contact pad. The temperature of the silver pad was elevated to about 100° C. (higher temperatures, e.g., 150-200°, could be utilized).

The resistivities of the contacts made by the procedures of Examples 1-6 are summarized in Table I. Data for these samples were obtained using a four terminal technique (to eliminate the large lead-resistance correction that otherwise would have to be applied) with one voltage tap indium soldered directly to the superconductor close to the contact pad. Two wires were attached to the current pad, one to carry current, the other to detect voltage at the surface of the pad. The other voltage tap was soldered directly to the superconductor close to the contact pad using indium solder (low contact resistivity was not needed for the voltage detection leads). The room temperature value of the contact resistivity was corrected, where necessary, for the short length of normal $Y_1Ba_2Cu_3O_{7-\delta}$ material between the contact pad and the voltage tap on the superconductor by measuring the resistivity per unit length of superconductor using another voltage tap attached to the superconductor. Accuracy of the contact resisitivity measurement was about ±10%.

where the superconductor has been exposed to air for an extended period of time.

The low resistivity values shown in Table I were unchanged when the role of the current and voltage leads were reversed. With current introduced into the voltage lead and voltage detected using the current lead, the contact resistivities were the same to within 1%. The contact resistivity remained the same for both current directions. Also there was no measurable increase in resistivity with time as current flowed through the contact.

Unlike conventional indium contacts which were semiconducting in character, increasing as the temperature was lowered, the resistivity of the contacts of the present invention were metallic in character, decreasing in resistivity 4 to 12 times on cooling from 295° K. to 76° K. (see the second last column in Table I).

Contacts made using the method of the present invention, unlike conventional indium solder contacts, showed negligible degradation over several months. The contact pads appear to protect the surface of the superconductor from deterioration due to exposure to air. The contact of Example 6, for example, maintained

TABLE I

| Contact Pad* | External Lead Connection | Contact Pad Area, Ac in mm² | Contact resistance R at 295K in mΩ | Contact resistance R at 76K in mΩ | Resistance ratio R (76K)/ R(295K) | Surface resistivity R(76) × Ac in μΩ −cm² |
|---|---|---|---|---|---|---|
| 5.9 um Au | In-2% Ag solder | 31 | 1.4 | 0.60 | 0.43 | 180 |
| 5.9 um Au | Au ribbon bond | 0.21 | 39 | 14 | 0.36 | 29 |
| 1.4 um Ag | In-2% Ag solder | 14 | 5.5 | 0.44 | 0.08 | 62 |
| 2.5 um Ag | Au ribbon bond | 0.07 | 87 | 19 | 0.22 | 13 |
| 2.5 um Ag | Au ribbon bond | 0.17 | 30 | 7.9 | 0.26 | 13 |
| 2.5 um Ag | Au ribbon bond | 0.06 | 59 | 15 | 0.32 | 9 |

*made by sputter deposition of the indicated inert metal after sputter etching

As shown in the last column of Table I, the lowest contact resistivities were obtained with silver contact pads and wire bonded leads. The contact resistivities for these contacts (Examples 4, 5 and 6) were consistently and reproducibly on the order of $10^{-5}$ $\Omega\text{-cm}^2$, or about three to four orders of magnitude lower than conventional contacts made from indium, silver paint, or pressure contacts. Contacts with soldered wire leads (Example 1 and 3) had a resistivity that was several times larger than the contacts with wire-bonded leads, but still several orders of magnitude lower than the earlier contacts When gold was used for the contact pad (Examples 1 and 2), the contact resistivities were somewhat higher than for silver. This may have resulted from a better bonding of the silver with the $Y_1Ba_2Cu_3O_7$ surface. Contacts with soldered wire leads (Examples 2, 4, 5 and 6) had resistivities that were several times larger than the contacts with wire-bonded leads, but still several orders of magnitude lower than earlier contacts. Alloying of the solder with the noble metal pad may have slightly degraded the contact interface.

When the procedure of the examples was employed with samples exposed to air for about nine weeks, resistivity was about an order of magnitude higher than contacts made with samples exposed to air for about only an hour. Additional sputter etching prior to deposition of the inert metal appears required in those cases its low resistivity after being stored in dry air for over four months.

A number of contacts have been made using the method of the present invetion with reproducible results. Stability of the contacts with time and use also appears to be excellent. The contacts made thus far have ranged in area from 0.1 to 10 square millimeters, but there is no inherent size limitation and much larger or smaller contact areas can be utilized. The contacts potentially can be photlithographically configured. The contacts showed consistently low resistivity and little degradation when exposed to dry air over a four-month period when repeatedly cycled between room temperature and 76° K.

Modifications of the general method described herein will also result in low contact resistivities. Glow-discharge cleaning and evaporative deposition of noble metals can yield low resistivity contacts, although sputter deposition generally results in superior adhesion.

The method of the present invention is applicable to bulk samples, to thin films, and to single crystals of $Y_1Ba_2Cu_3O_x$. It is also applicable to $La_{1.85}Sr_{0.15}CuO_4$ as well as to other metal oxide high-Tc superconductors.

A key aspect of the present invention is attaching the contact to a non-degraded surface of the high-Tc superconductor. Such a surface can be achieved by abrading off the degraded surface layer of a superconductor exposed to air. An alternate approach is to make the contact pad immediately after the ceramic superconductor has been fired or to protect the surface of the superconductor from an exposure to air, or by sealing it in an oxygen atmosphere or an inert atmosphere free from water vapor and carbon dioxide. Or the freshly prepared ceramic may be encased or sealed with a gas-impermeable coating fabricated of a resin which is non-reactive with the ceramic and which can be removed, for example, by sputter-etching.

What is claimed is:

1. A method for making a low surface resistivity contact to a high-Tc oxide superconductor with at least one surface, subjecting said surface of said superconductor to abrading or etching in a manner such that said surface assumes a substantially non-degraded state, maintaining said surface in said substantially non-degraded state, and depositing a noble metal on said surface by sputter or evaporative deposition while said surface remains in said substantially non-degraded state to form a metallic contact pad on said surface of said superconductor with low surface resistivity being established between said contact pad and said surface.

2. A method according to claim 1, wherein the noble metal is silver or gold.

3. A method according to claim 1, wherein the surface resistivity between said contact pad and said surface is less than about $10^{-5}$ $\Omega$-cm$^2$.

4. A method according to claim 1, wherein said method further comprises connecting a lead to said contact pad.

5. A method according to claim 4, wherein the lead is connected to the contact pad by soldering or by thermosonic bonding.

6. A method according to claim 4, wherein the lead is connected to the contact pad by soldering with indium or low melting temperature indium alloy.

7. A method according to claim 4, wherein the lead is made of a conductive metal.

8. A method according to claim 7, wherein the conductive metal is copper, gold, aluminum or silver.

9. A method according to claim 1, wherein the oxide superconductor is $Y_1Ba_2Cu_3O_x$.

10. A method according to claim 1, wherein the surface resistivity of the contact is less than about 200 $\mu\Omega$-cm$^2$.

11. A method for making a low surface resistivity contact to a high-$T_c$ oxide superconductor which comprises providing a high-$T_c$ oxide superconductor with at least one surface, sputter-etching said surface so that said surface is in a substantially non-degraded state, and sputter-depositing a noble metal onto said sputter-etched surface while said surface is in substantially non-degraded state to form a metallic layer at said surface of said superconductor with a surface resistivity between said metallic layer and said surface of less than about 1000 $\mu\Omega$-cm$^2$ at high-$T_c$ oxide superconductor operating temperatures.

12. A method for making a low surface resistivity contact to a high-$T_c$ oxide superconductor which comprises providing a high-$T_c$ oxide superconductor by forming said superconductor with at least a surface that is in a substantially non-degraded state, minimizing exposure of said surface of said superconductor to air to thereby maintain said surface in said substantially non-degraded state, and depositing a noble metal on said surface while said surface is in said substantially non-degraded state to form a metallic layer contact pad at said surface of said superconductor with a surface resistivity between said metallic layer and said surface of less than about 1000 $\mu\Omega$-cm$^2$ at high-$T_c$ oxide superconductor operating temperatures.

13. A method according to claim 12, wherein said metal contact pad is formed on the surface of the superconductor within about two hours after the superconductor has been formed, and wherein exposure of the superconductor to air is minimized at all times prior to forming the metal contact pad.

14. A method according to claim 12, wherein the superconductor, after being formed, is kept under vacuum in an inert medium or in a pure oxygen atmosphere free of water vapor and carbon dioxide, and without exposing the superconductor to air, prior to forming the metal contact pad.

15. A method according to claim 12, wherein the superconductor, after being formed, is protected by a removable coating which is removed just prior to forming the contact pad without exposing the superconductor to air.

16. A method according to claim 12, further comprising connecting a lead to the metal contact pad.

17. A method according to claim 16, wherein the lead is connected to the metal contact pad by soldering or by thermosonic bonding.

18. A method according to claim 17, wherein the lead is connected to the metal contact pad by soldering with indium or a low melting indium alloy.

19. A method according to claim 11, wherein said steps of sputter-etching and sputter-depositing are carried out at temperatures below about 100° C.

20. A method according to claim 11, wherein a lead is connected to said noble metal and wherein said steps of sputter-etching, sputter-depositing and connection of said lead are carried out at temperatures below about 200° C.

21. A method according to claim 11, wherein the metal-oxide superconductor is $Y_1Ba_2Cu_3O_x$.

* * * * *